(12) United States Patent
Govindaraj

(10) Patent No.: US 10,833,638 B2
(45) Date of Patent: Nov. 10, 2020

(54) HIGH-EFFICIENCY POWER AMPLIFIER SYSTEM FOR WIRELESS POWER TRANSMITTERS

(71) Applicant: Verily Life Sciences LLC, South San Francisco, CA (US)

(72) Inventor: Arvind Govindaraj, San Bruno, CA (US)

(73) Assignee: VERILY LIFE SCIENCES LLC, South San Francisco, CA (US)

(*) Notice: Subject to any disclaimer, the term of this patent is extended or adjusted under 35 U.S.C. 154(b) by 0 days.

(21) Appl. No.: 16/225,341

(22) Filed: Dec. 19, 2018

(65) Prior Publication Data

US 2019/0207570 A1 Jul. 4, 2019

Related U.S. Application Data

(60) Provisional application No. 62/611,750, filed on Dec. 29, 2017.

(51) Int. Cl.
*H03F 3/24* (2006.01)
*H02J 50/12* (2016.01)
(Continued)

(52) U.S. Cl.
CPC .......... *H03F 3/2173* (2013.01); *H02J 7/0072* (2013.01); *H02J 7/00711* (2020.01);
(Continued)

(58) Field of Classification Search
USPC ........................................ 330/10, 251, 207 A
See application file for complete search history.

(56) References Cited

U.S. PATENT DOCUMENTS 8,643,326 B2* 2/2014 Campanella ............. H01Q 7/00
320/108
2011/0121920 A1 5/2011 Kurs et al.
(Continued)

FOREIGN PATENT DOCUMENTS

KR 20150115339 10/2015

OTHER PUBLICATIONS

International Application No. PCT/US2018/06648, "International Search Report and Written Opinion", dated Apr. 12, 2019, 15 pages.
(Continued)

*Primary Examiner* — Hieu P Nguyen
(74) *Attorney, Agent, or Firm* — Kilpatrick Townsend & Stockton LLP

(57) ABSTRACT

One example device for providing wireless power includes a power supply; a power amplifier coupled to the power supply, the power amplifier comprising a first switch and a second switch coupled to the power supply and to a common switch output, and a pulse-width modulator ("PWM") coupled to the power amplifier, the PWM configured to substantially simultaneously toggle each of the first and second switches between open and closed states, and to maintain the first and second switches in opposite open and closed states; a controller coupled to the power supply and the PWM, the controller configured to: receive a sensor signal indicating an impedance of a load; determine a duty cycle of the PWM based on the sensor signal; and adjust an output voltage of the power supply based on the duty cycle of the PWM.

18 Claims, 9 Drawing Sheets

(51) Int. Cl.
  *H03F 3/217* (2006.01)
  *H03F 1/02* (2006.01)
  *H02J 7/00* (2006.01)
  *H04B 5/00* (2006.01)
  *H02M 3/335* (2006.01)

(52) U.S. Cl.
  CPC ............ *H02J 50/12* (2016.02); *H03F 1/0233* (2013.01); *H03F 3/245* (2013.01); *H04B 5/0037* (2013.01); *H02M 3/33515* (2013.01); *H03F 2200/351* (2013.01); *H03F 2200/387* (2013.01); *H03F 2200/393* (2013.01)

(56) References Cited

U.S. PATENT DOCUMENTS

2017/0187240 A1  6/2017  Cho et al.
2017/0237302 A1  8/2017  Sorge

OTHER PUBLICATIONS

Jin et al., "Circuits and systems for efficient portable-to-portable wireless charging", Diss. Massachusetts Institute of Technology, 2014.

Mung et al., "Design and construction of wireless charging system using inductive coupling", International Journal of Scientific & Technology Research, vol. 4, Issue 6 (2015): 282-287.

Linear Technology, "5W AutoResonant Wireless Power Transmitter Offers Foreign Object Detection & Completes LTC's Wireless Charging Solution", <www.linear.com> Nov. 30, 2015, 3 pages.

Linear Technology, "LTC4120/LTC4120-4.2 Wireless Power Receiver and 400mA Buck Battery Charger", copyright 2013, 32 pages.

Low et al., "Method of Load/Fault Detection for Loosely Coupled Planar Wireless Power Transfer System with Power Delivery Tracking", IEEE Transactions on Industrial Electronics vol. 57, No. 4, Apr. 2010, pp. 1478-1486.

* cited by examiner

HIGH-EFFICIENCY POWER AMPLIFIER SYSTEM FOR WIRELESS POWER TRANSMITTERS

CROSS-REFERENCE TO RELATED APPLICATIONS

This application claims priority to U.S. Provisional Application No. 62/611,750, filed Dec. 29, 2017, entitled "High-Efficiency Power Amplifier System for Wireless Power Transmitters," which is hereby incorporated by reference in its entirety herein.

FIELD

The present disclosure generally relates to power amplifiers, and more generally relates to high-efficiency power amplifier system for wireless power transmitters.

BACKGROUND

High frequency magnetic fields may be used to wirelessly provide power to a remote device. A typical implementation consists of a resonant two-coil system with a transmit ("TX") coil and a receive ("RX") coil. A power amplifier (PA) system or driver drives the TX coil with a high-frequency AC current of an application-specific magnitude. However unlike radio frequency ("RF") communication applications where the PA feeds a substantially constant impedance load, a TX coil can present a variable impedance load due to changes in the coupling between the TX and RX coils, the presence of foreign objects, etc. Such changes in the impedance load can reduce the efficiency of the power transfer.

SUMMARY

Various examples are described for high-efficiency power amplifier system for wireless power transmitters. One example device for providing wireless power includes a power supply; a power amplifier coupled to the power supply, the power amplifier comprising a first switch and a second switch coupled to the power supply and to a common switch output, and a pulse-width modulator ("PWM") coupled to the power amplifier, the PWM configured to substantially simultaneously toggle each of the first and second switches between open and closed states, and to maintain the first and second switches in opposite open and closed states; a controller coupled to the power supply and the PWM, the controller configured to: receive a sensor signal indicating an impedance of a load; determine a duty cycle of the PWM based on the sensor signal; and adjust an output voltage of the power supply based on the duty cycle of the PWM.

One example method for providing wireless power includes receiving an indication of a load impedance; determining a duty cycle based on the load impedance; determining a power supply voltage based on the duty cycle; adjusting a power supply to supply the power supply voltage; toggling a first switch and a second switch between open and closed states to generate a power supply output, a ratio of the toggling based on a duty cycle, the first switch and second switch switched to maintain them in opposite open or closed states; and outputting the power supply output to a radio frequency ("RF") transmit coil.

One example non-transitory computer-readable medium comprising processor-executable instructions configured to cause a processor to receive an indication of a load impedance; determine a duty cycle based on the load impedance; determine a power supply voltage based on the duty cycle; adjust a power supply to supply the power supply voltage; and transmit a signal to a power amplifier to establish a duty cycle to toggle a first switch and a second switch between open and closed states to generate a power supply output, a ratio of the toggling based on the duty cycle, the first switch and second switch switched to maintain them in opposite open or closed states.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples.

DETAILED DESCRIPTION

Figure 1:
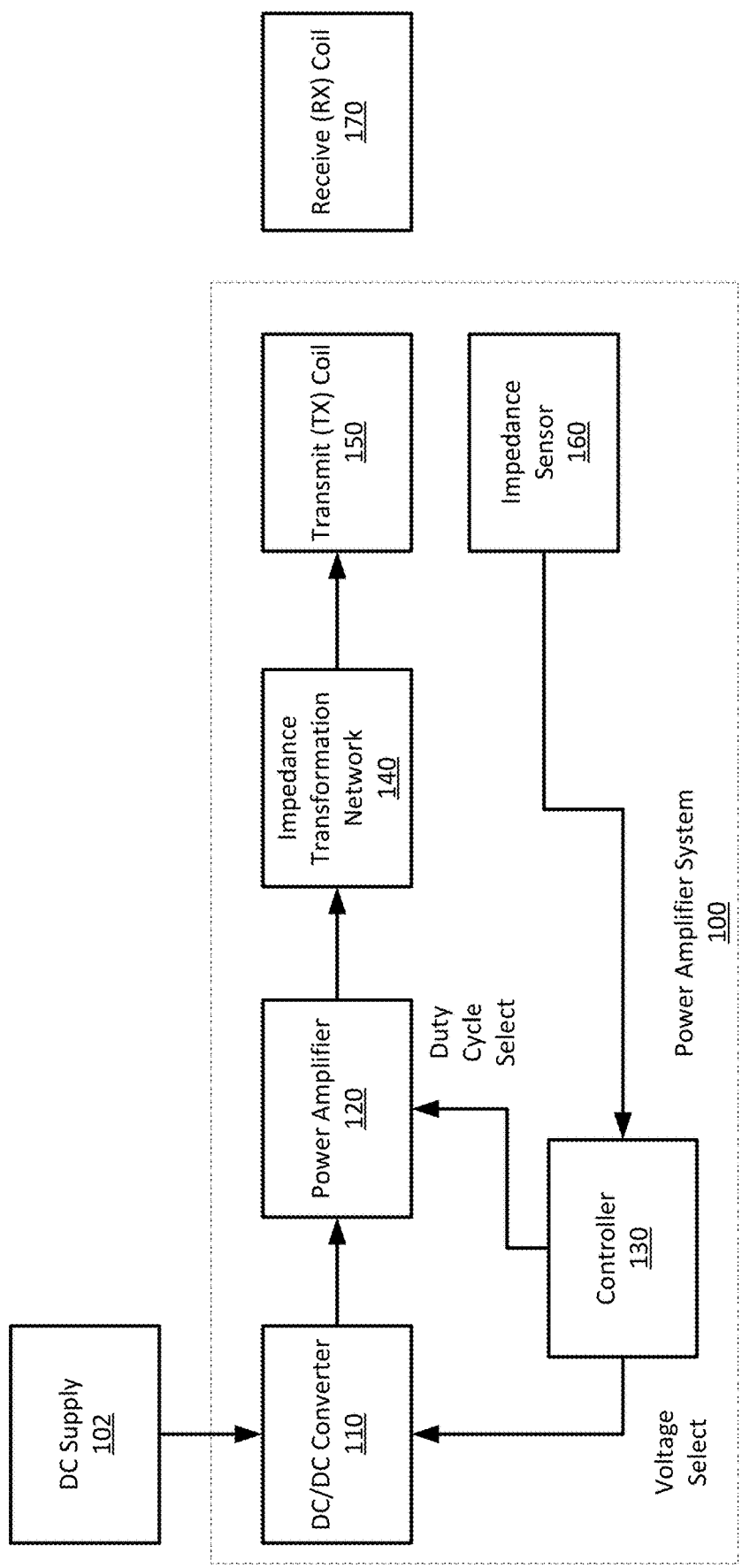
FIG. 1 shows an example high-efficiency power amplifier system for wireless power transmitters.

Examples are described herein in the context of high-efficiency power amplifier system for wireless power transmitters. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Power may be wirelessly transferred from a power supply to a device by inducing an electromagnetic field ("EMF") in a TX coil and positioning an RX coil within the EMF, which induces a current in the RX coil, which may then be supplied to the receiving device. However, the efficiency of power transfer relies on closely matching the impedance of the load with the design of the power supply. Variations in the load impedance thus tend to cause power transfer to become inefficient.

To accommodate varying load impedances, an example power supply according to this disclosure employs a variable direct current ("DC") to DC ("DC/DC") converter that is coupled to a power amplifier cell driven by a pulse-width modulation ("PWM") driver that toggles two switches (arranged as a half-bridge) according to a PWM duty cycle (or just "duty cycle") to generate an output signal to be supplied to a transmit coil. By varying the duty cycle, the power supply's efficiency can be maintained across a range of load impedances. In addition, by also adjusting the voltage supplied by the DC/DC converter to the power amplifier based on the changing duty cycle, a substantially constant current output can be maintained. Thus, as the load impedance changes, the duty cycle changes to maintain efficient power transfer to the load, and the voltage output of the power DC/DC converter changes to maintain a constant output current to the load based on the changing duty cycle.

To further help accommodate load impedance variations, a passive filter and load mapping network (or "impedance transformation network" or "reactance switching network") may be incorporated between the output of the half-bridge structure and the input of the transmit coil to transform an expected load impedance range to a range of impedances to be accommodated by the design of the power supply. Further, the impedance transformation network may incorporate low-pass or high-pass filter components to reduce the amplitude of harmonic power from the transmit coil. The size and complexity of the impedance transformation network design may vary based on the expected range of impedances through which the power supply may transfer power without significant efficiency losses.

This illustrative example is given to introduce the reader to the general subject matter discussed herein and the disclosure is not limited to this example. The following sections describe various additional non-limiting examples and examples of high-efficiency power amplifier systems for wireless power transmitters.

Referring now to FIG. 1, FIG. 1 shows an example high-efficiency power amplifier system 100 for wireless power transmitters. The system 100 in this example includes a DC/DC converter 110 that receives a DC voltage from DC supply 102 and supplies a selectable DC voltage to a power amplifier 120. The output of the power amplifier 120 passes through the impedance transformation network 140 before reaching the transmit coil 150, where an EM field is generated to excite and supply power to the receive coil 170. The system 100 also includes a sensor 160 that senses the load impedance (including the TX coil in this example), at the power transmission frequency in this example, and provides an indication of the load impedance to a controller 130. The controller receives the load impedance and selects a duty cycle for the power amplifier 120 corresponding to the sensed load impedance. The selected duty cycle is then used to identify an output voltage for the DC/DC converter 110 to maintain a constant current to the load. Thus, as the load impedance varies, such as due to relative movement between the TX coil 150 and RX coil 170, interfering objects in the environment, deformation of either or both of the TX or RX coils 150, 170, etc., the changing load impedance is provided to the controller, which adjusts system parameters—duty cycle and DC voltage—to maintain efficient power transfer to the load.

The DC/DC converter 110 may be any suitable DC/DC converter that can supply a selectable output voltage, such as a variable output switched-mode DC/DC converter. It should be appreciated that any suitable variable DC output power source may be employed. For example, DC supply 102 may be an alternating current ("AC") supply and DC/DC converter 110 may be an AC/DC converter having a selectable output voltage.

The power amplifier 120 in this example is a soft-switching half-bridge power amplifier using MOSFET switches. A PWM switches the MOSFETS according to a duty cycle setting supplied to the PWM. The power amplifier 120 is configured to operate in a zero-voltage switching ("ZVS") and zero-current switching ("ZCS") mode to reduce switching losses. Thus, the voltage and current through the switches do not overlap in this example. Other examples, however, may employ other switching configurations, including hard switching configurations. Further, while ZVS and ZCS may not be achievable over a full range of load impedances, designing the power amplifier to provide as close to ZVS and ZCS as is practical may provide more efficient power transfer.

The impedance transformation network 140 comprises one or more passive circuit elements, e.g., capacitors ("C"), resistors ("R"), or inductors ("L"), to convert an expected range of load impedances to a desired range of impedances for the power amplifier 120. In some examples, the impedance transformation network 140 may include one or more filters, e.g., low pass or high pass filters, to reduce the amplitude of harmonic power from the transmit coil 150. As is known, impedance transformation networks, depending on their complexity, may provide wide impedance ranges, however, in some examples according to this disclosure, a footprint size of example power amplifier systems may be constrained to operate in relatively small wearable or handheld devices. Thus, an impedance transformation network may include a small component-count filter circuit, e.g., an LC low-pass filter, or other relatively simple passive low-pass or high-pass filters, e.g., simple RC, LC, or RLC filters. However, in some examples, more complex impedance transformation networks may be employed to accommodate a wider range of impedances for the power amplifier 120.

The impedance sensor 160 is positioned to sense an impedance across the load, including the TX coil in this example, and to provide sensor signals to the controller 130. Any suitable impedance sensor may be employed. Further, the sensor signal may comprise a digital value indicating the impedance, e.g., 13+8j ohms, or it may provide signals representing the magnitudes of the real and imaginary components of the sensed impedance. In some examples, the impedance sensor 160 outputs a voltage or current indicative of the sensed impedance.

The controller 130 in this example includes a processor and a memory. The processor receives a signal from the impedance sensor 160 and executes processor-executable instructions stored in the memory to determine a duty cycle for power amplifier 120. To determine the duty cycle, the processor may access a look-up table stored in the memory that maps load impedance to duty cycle. In some examples, however, the processor may access a mapping function that accepts an impedance as an input and determines a duty cycle as an output. A mapping function may include one or more equations characterizing the relationship between load impedance and a duty cycle providing optimal, or nearoptimal, efficiency for the power amplifier. For example the mapping function may comprise one or more polynomial mapping functions generated based on a modelled or empirically determined response of the power amplifier system 100 to different load impedances at different duty cycles.

The controller 130 also executes processor-executable instructions stored in the memory to determine an output voltage for the DC/DC converter 110. In this example, the output voltage changes as a function of the duty cycle to supply a substantially constant current to the load on the power amplifier 120. In this example, the processor accesses a second look-up table that maps duty cycles to output voltages. Thus, after the processor determines the duty cycle based on the sensed load impedance, the processor uses the determined duty cycle to select a corresponding output voltage. It should be appreciated that a mapping between a duty cycle and a voltage may be established for a particular output current, thus, multiple look-up tables may be stored in memory corresponding to various output currents, or a lookup table may include multiple mappings from duty cycle to voltage based on a configured amount of current. Further, in some examples, a mapping between duty cycle and an output voltage may be defined by one or more equations characterizing the relationship between duty cycle and output voltage that provides substantially constant current to the TX coil 150. For example, the mapping function may comprise one or more polynomial mapping functions generated based on a modelled or empirically determined response of the power amplifier system 100 to different duty cycles and voltages.

In this example, the system 100 is incorporated into a handheld device usable to supply wireless power to a target device, such as a battery-powered implant or a battery-powered wearable device. However, examples according to this disclosure may be incorporated into any suitable device, including stationary or other non-portable devices, to provide wireless power to any suitable target device, including mobile phones (e.g., smartphones), wireless headsets, tablets, portable game consoles, wireless user interface devices (e.g., wireless mice, wireless game controllers, etc.), etc. Power transmitted by the system 100 may be used to recharge batteries in the target device, to power the target device, or both.

Figure 2:
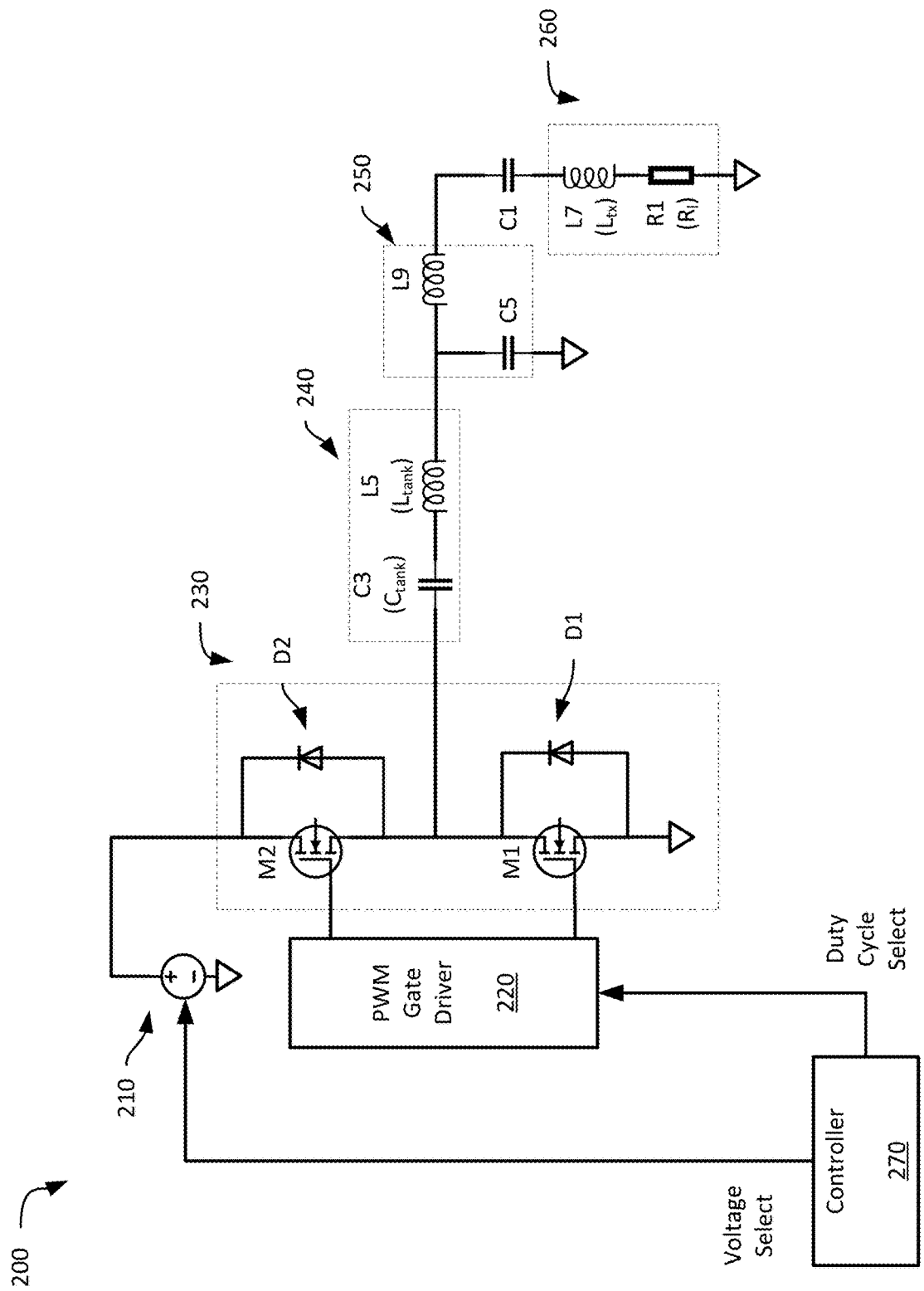
FIG. 2 shows an example high-efficiency power amplifier system for wireless power transmitters.

Referring now to FIG. 2, FIG. 2 shows an example high-efficiency power amplifier system 200 for wireless power transmitters. The example system 200 includes a DC/DC power supply 210 with selectable output voltage, as discussed above with respect to FIG. 1. It should be appreciated that any suitable DC power supply with an adjustable DC output voltage may be employed as the power supply 210, including adjustable AC/DC supplies. The power amplifier includes two MOSFETs M1-M2 arranged as switches in a half-bridge configuration. The PWM gate driver 220 is connected to the gates of each of the MOSFETs M1-M2 and toggles the gates to switch them on and off. The PWM gate driver 220 maintains the MOSFETs M1-M2 in opposite states, such that M1 has the opposite state—on or off—as M2, and operates them in a ZVS and ZCS mode. The PWM gate driver 220 toggles the switches according to a duty cycle selected by a controller (not shown) to provide an output signal to the tank circuit 240, which in combination with the low pass filter 250, provides the impedance transformation network. The output of the low-pass filter 250 is provided to the load 260, which includes the transmit coil L7 and the receive coil and circuitry, represented by resistance $R_1$ (R1). The controller 270 provides a duty cycle select signal to the PWM gate driver 220 and provides a voltage select signal to the DC/DC converter 210.

In this example, each MOSFET M1-M2 has a respective diode D1-D2 coupled between its source and drain to circulate power through the respective MOSFET M1-M2, thereby allowing the power amplifier to accommodate a larger amount of load reactance. Schottky diodes, having low voltage drops, may be employed as D1-D2 to provide efficient circulation of energy, though other types of diodes may be employed according to some examples. Further, while the MOSFETs M1-M2 are operated substantially in a ZVS and ZCS mode, variations in load reactance may result in ZVS and ZCS conditions not being met across the entire range of load reactances, though such a configuration may still enable reduced power dissipation across the entire range of load reactances.

The tank circuit 240 is configured to operate in resonance at the desired transmission frequency, such as by providing substantially 0 ohms of resistance at resonance, or it may be employed to provide a predetermined impedance shift away from a resonant frequency. The filter 250 is used to both provide low pass filtering of the power amplifier output, as well as to convert a range of load impedances to a predetermined range of impedances to present to the power amplifier 230. The range of load impedances may then be used by the controller 270 to select duty cycles for the PWM gate driver 220.

Figure 3:
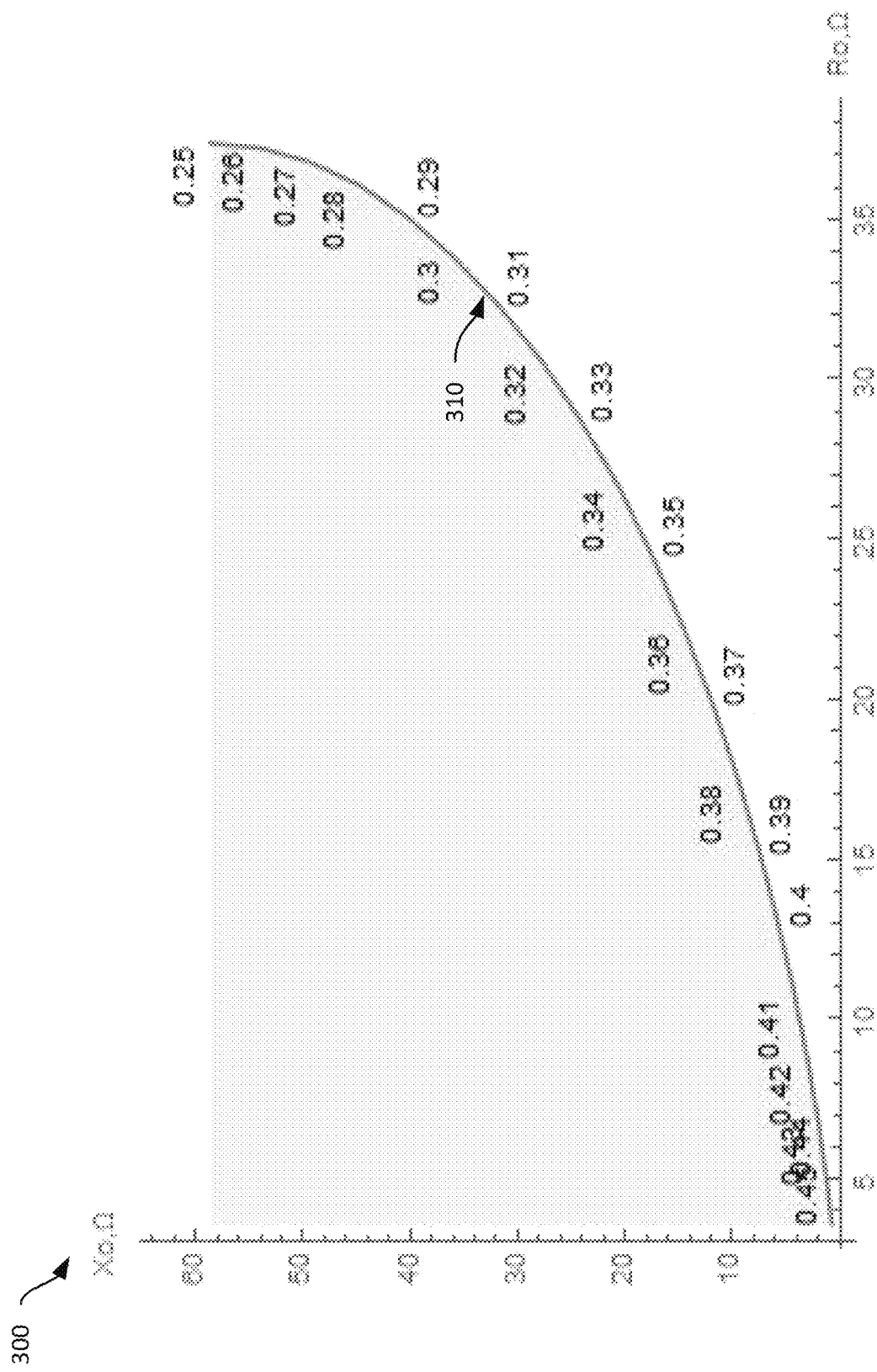
FIG. 3 shows a plot of duty cycles to achieve a target impedance.

For example, referring to FIG. 3, FIG. 3 shows a plot 300 of duty cycles to achieve high efficiency at a target impedance within an impedance plane, where the x-axis represents resistance and the y-axis represents reactance. As can be seen, a curve 310 represents a correspondence between a duty cycle (normalized to a range from 0 to 1) and a load impedance. The points on the curve 310 represent the duty cycle for a particular impedance that provides optimal efficiency of power transfer from the power amplifier at that impedance. Deviation from the curve 310, such as due to limitations of the tank circuit and filter 250, may result in reduced efficiency in power transfer, however, as will be seen with respect to FIG. 4, close approximations to the curve 310 may still provide relatively efficient power transfer. The design of a circuit may affect the range of impedances within which the power supply 210 can efficiently transfer power to a target device. For example, the relatively simple impedance transformation network, including filter 250 shown in FIG. 2, may closely approximate the curve 310 over a small range of impedances before substantially deviating. More complex impedance transformation networks may be designed to allow a power supply to approximate the curve 310 over a wider range of load impedances, though such impedance transformation networks may require more physical layout space.

Figure 4:
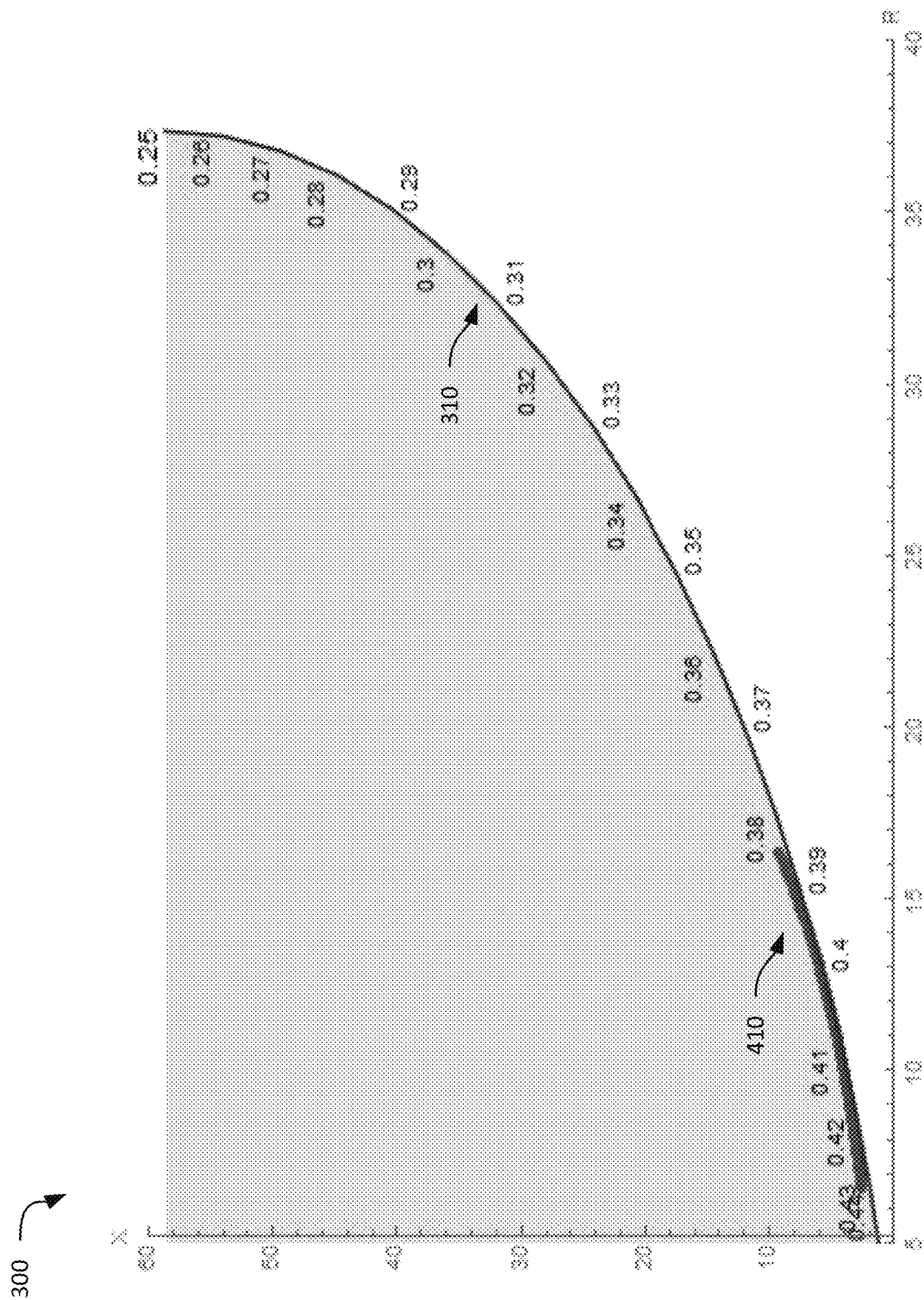
FIG. 4 shows a load impedance for a load applied to a high-efficiency power amplifier employing a passive impedance transformation network.

The filter 250 in this example employs a capacitor C5 and an inductor L9 and provides an approximation of the curve 310 shown in FIG. 3 over a range of load inductances as shown in FIG. 4. In this example, C3 has a value of 26.3 nanofarads ("nF") and the inductor has a value of 350 nanohenries ("nH"). The filter 250 employs a capacitor C5 with a value of 5.2 nF and an inductor L9 with a value of 94 nH. Using these circuit components, the power amplifier operates along approximation curve 410 in FIG. 4. As can be seen, the approximation curve 410 closely approximates curve 310 across a range of load impedances of approximately 1 to 3 ohms before beginning to deviate. Thus, the power supply 210 is able to efficiently transfer power despite a 50% increase or decrease in load impedance from a midpoint load impedance of 2 ohms by varying a PWM duty cycle between 0.38 and 0.43.

Figure 5:
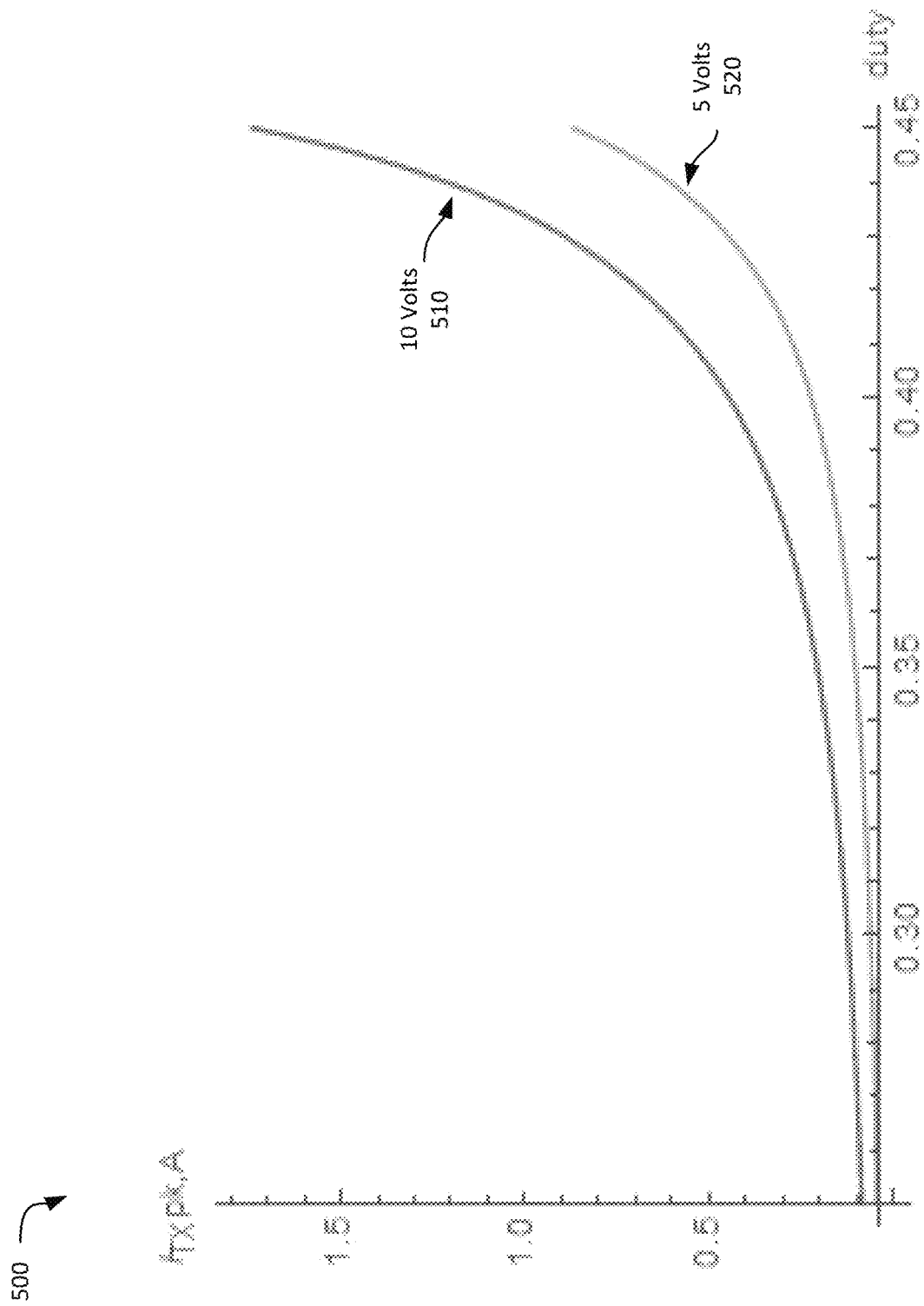
FIG. 5 shows a plot of power supply voltages to achieve a target current at a selected duty cycle.

Referring again to FIG. 2, in addition to adjusting a duty cycle setting for the PWM gate driver 220, the controller 270 adjusts the power supply 210 output based on the PWM duty cycle. Referring to FIG. 5, FIG. 5 shows two curves 510, 520 representing current supplied to the transmit coil L7 (y-axis) by the power supply 210 across a range of duty cycles (x-axis) at a particular voltage. In this example, the upper curve 510 represents the output at 10 volts, while the lower curve 520 represents the output at 5 volts. Thus, based on an amount of current to be supplied to the transmit coil L7, the voltage output by the DC/DC converter 210 is adjusted based on the duty cycle. In this example, a decrease in the duty cycle corresponds to an increase in the voltage output by the DC/DC converter 210. For example, to maintain a current of approximately 0.4 amps for change in the duty cycle from 0.43 to 0.39, the output of the DC/DC converter would increase from approximately 5 volts to approximately 10 volts. Thus FIG. 5 represents a portion of a three-dimensional surface, where the x-axis represents duty cycle, the y-axis represents transmit coil current, and the z-axis represents DC/DC converter output voltage. Using such a surface, a combination of duty cycle and current can be employed to select a DC/DC converter output voltage. Thus, in some examples, the lookup table may be a two-dimensional array.

Figure 6:
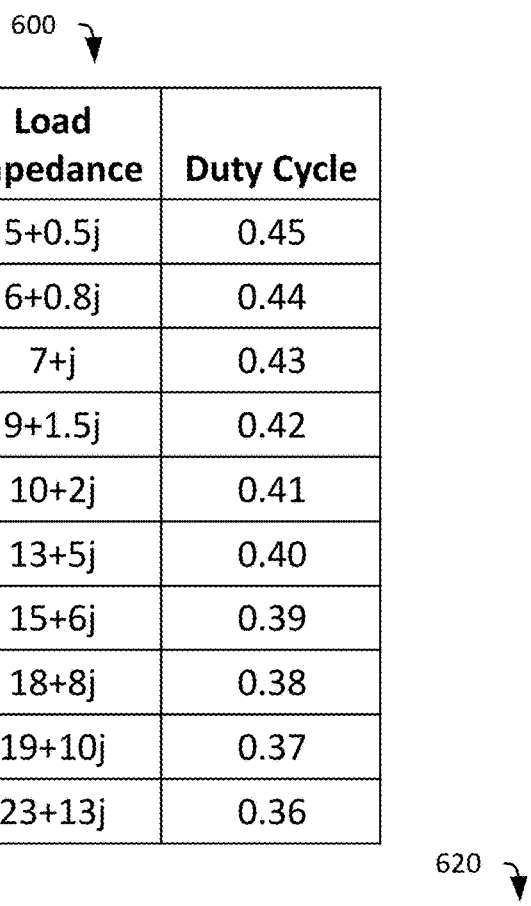
FIG. 6 shows example look-up tables for providing high-efficiency wireless power transfer.

Referring now to FIG. 6, FIG. 6 shows example look-up tables 600-620 providing mappings between load impedance and duty cycle, and duty cycle and DC/DC converter 210 output voltage, respectively. Thus, the controller 270 may receive an indication of a load impedance from an impedance sensor (not shown) and select a duty cycle from look-up table 600. The selected duty cycle may then be used to look up a corresponding DC/DC converter output voltage from a look-up table 610 for a desired current level. Additional look-up tables mapping duty cycle to DC/DC converter output voltage may be employed for different amounts of current. Alternatively, a two-dimensional array 620 may be employed to provide a mapping between a duty cycle and an output current. The example array 620 shown in FIG. 6 provides a mapping for any duty cycle from 0.01 to 0.99 and any current value from 0.1 to 5.0 amps. Such an implementation may allow efficient indexing into the array to determine a DC/DC converter output voltage based on duty cycle and output current.

Figure 7A:
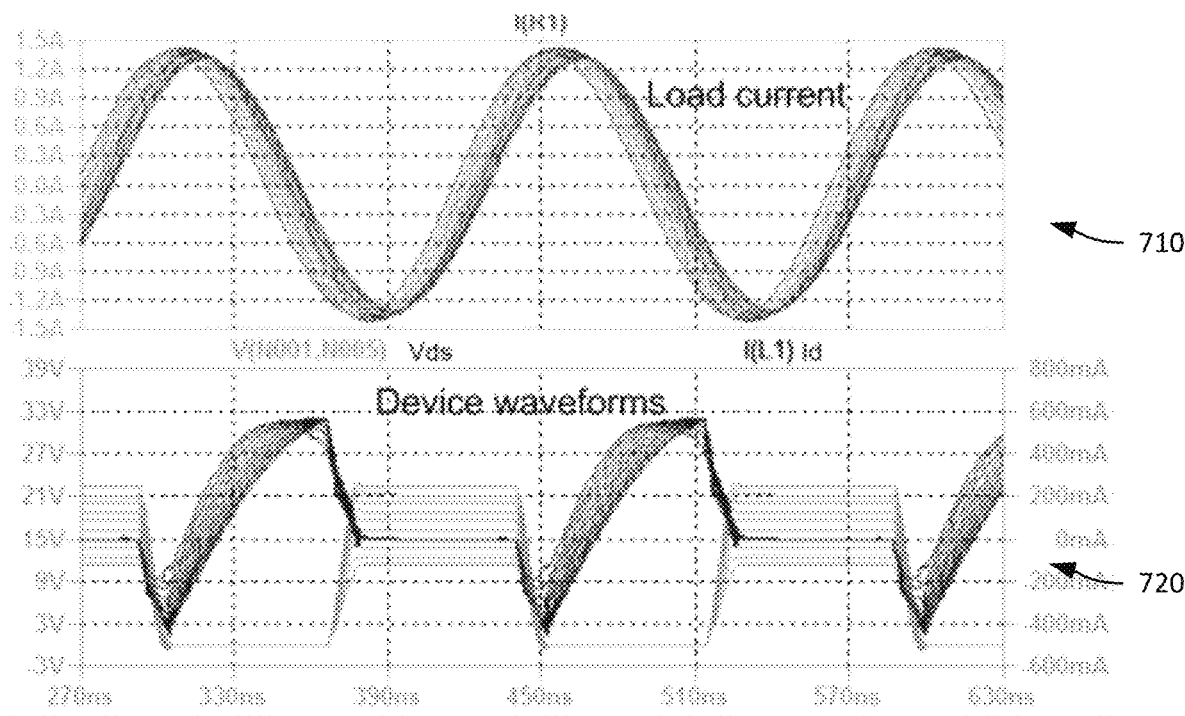
FIGS. 7A-7B show examples plots of circuit response over a range of load reactances.
Figure 7B:
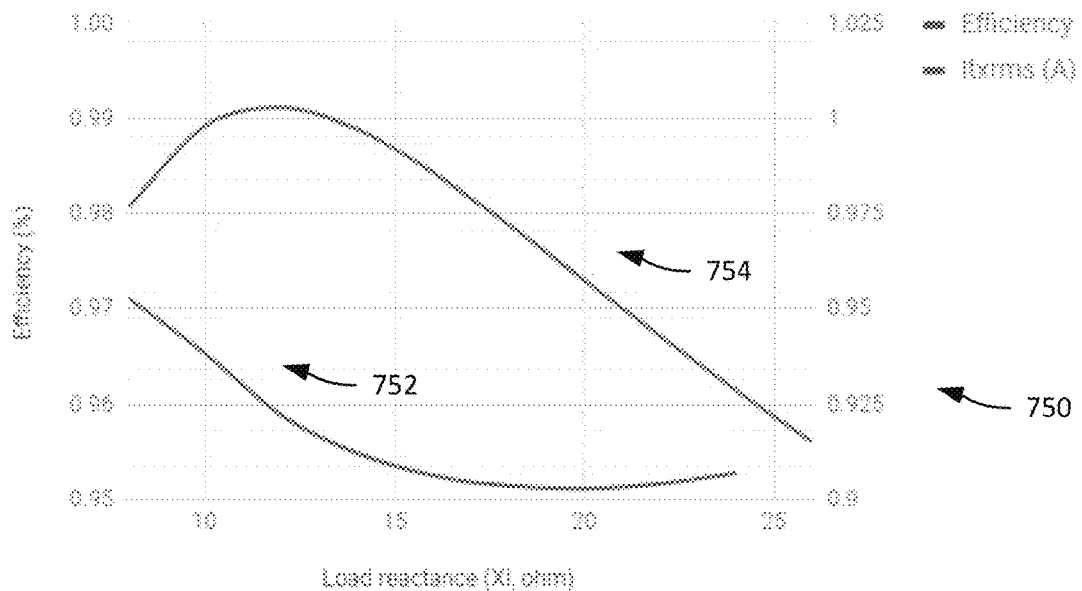

Referring now to FIGS. 7A-7B, FIG. 7A shows the effect on load current and output waveforms as load reactance changes. The upper plot 710 illustrates variations in load current as load reactance changes over time, while the lower plot 720 in FIG. 7A illustrates that changes in load reactance may result in the power amplifier 230 is not able to meet ZVS and ZCS conditions over the entire range of load reactances; however, the circuit retains much of the efficiency benefits over the range. FIG. 7B illustrates these efficiencies over the load reactance ranges. Specifically, it illustrates that over a load reactance of 8 ohms to 26 ohms, the efficiency 752 only decreases from approximately 97.1% to approximately 95.1%, while maintaining a load current 754 between approximately 0.92 amps and 0.99 amps over the range. Thus, while efficiency 752 and load current 754 do not remain perfectly constant over the full range of load reactances, the plots 752-754 illustrate examples of high efficiency and relatively constant current over a more-than threefold increase in load reactance.

Figure 8:
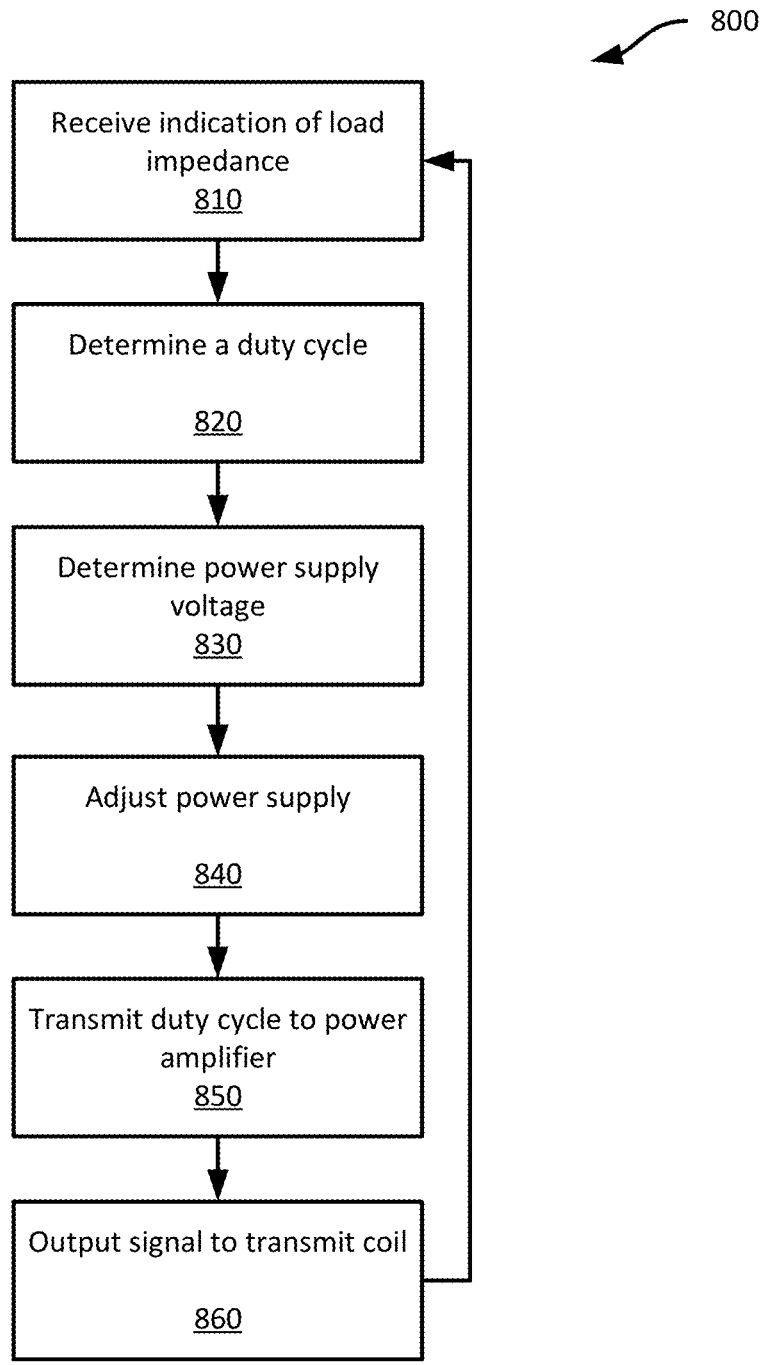
FIG. 8 shows an example method for providing high-efficiency wireless power transfer.

Referring now to FIG. 8, FIG. 8 shows an example method 800 for providing high efficiency power amplification for wireless power transmitters. The method 800 of FIG. 8 will be discussed with respect to the example system 100 shown in FIG. 1, but it should be appreciated that any suitable power amplifier system may be employed according to various examples, such as the example system 200 shown in FIG. 2 or with respect to the example controller 900 shown in FIG. 9.

At block 810, the controller 130 receives an indication of load impedance from the impedance sensor 860. In this example, the controller 130 receives a voltage signal from the impedance sensor 860 corresponding to a load impedance. However, in some examples, the controller 130 may receive a current signal, PWM signal, or a digital value indicating a load impedance. Still any other suitable impedance sensor may be employed.

At block 820, the controller 130 determines a duty cycle based on the load impedance. In this example, the controller 130 accesses a look-up table stored in memory and determines a duty cycle corresponding to the load impedance. However, in some examples, the controller 130 may determine a duty cycle based on the load impedance and a mapping function stored in memory. For example a mapping function may comprise one or more polynomial functions mapping load impedance to duty cycle, such as described above with respect to FIG. 1.

At block 830, the controller 130 determines a power supply voltage based on the determined duty cycle. In this example, the controller 130 accesses a look-up table and determines a power supply voltage corresponding to the determined duty cycle. However, in some examples, the controller may determine a power supply voltage based on the duty cycle and a mapping function. For example a mapping function may comprise one or more polynomial functions mapping duty cycle to power supply voltage, such as described above with respect to FIG. 1.

At block 840, the controller 130 transmits a signal to the DC/DC converter 110 to adjust its output voltage based on the determined power supply voltage. In this example, the signal is a voltage signal indicating the determined power supply voltage; however, any suitable signal may be provided, including a current signal, a digital value indicating an output voltage selection, a PWM signal, etc.

At block 850, the controller 130 transmits the determined duty cycle to the power amplifier 120. In this example, the controller 130 transmits a voltage signal to a PWM gate controller, such as the PWM gate controller 220 shown in FIG. 2, to establish the determined duty cycle. Other suitable signals may be employed according to different examples, such as current signals, digital values, etc. In some examples, the controller comprises a processor having an integrated PWM circuit, and thus, the controller 130 may adjust an output duty cycle of the PWM circuit to provide a PWM signal.

At block 860, the power amplifier 120 outputs a power signal to the transmit coil 150 using the impedance transformation network 140 based on the determined duty cycle.

It should be appreciated that while the method 800 of FIG. 8 is described in a particular order, other orderings may be possible. For example, blocks 840 and 850 may be reversed according to some examples, or may occur substantially simultaneously.

Figure 9:
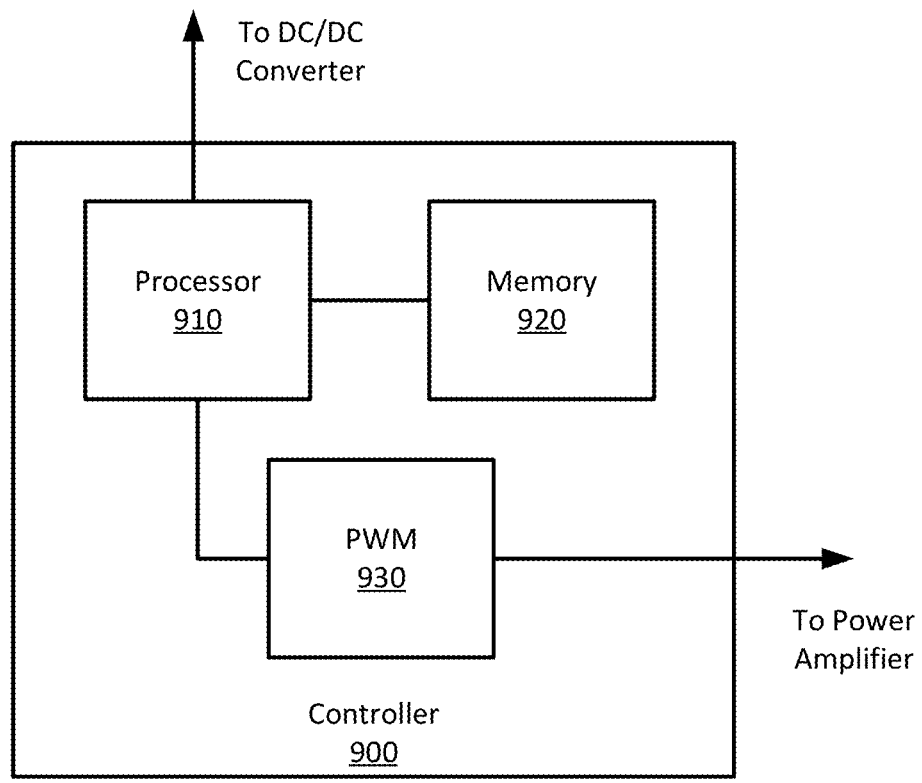
FIG. 9 shows an example controller for providing high-efficiency wireless power transfer.

Referring now to FIG. 9, FIG. 9 shows an example controller 900 according to one example. In this example, the controller 900 includes a processor 910, a memory 920, and a PWM circuit 930. The processor 910 is in communication with the memory 920 and is configured to execute processor-executable instructions stored in the memory 920. For example, the processor 910 may execute processor-executable instructions to perform one or more methods according to this disclosure, including example methods according to FIG. 8.

In this example, the controller 900 also includes a PWM circuit 930; however, other example controllers 900 may not include a PWM circuit 930. The PWM circuit 930 may be in communication with a power amplifier, such as the power amplifiers 120, 230 shown in FIG. 1 or 2. In one such example, the PWM circuit 930 replaces the discrete PWM gate driver 220 shown in FIG. 2. Alternatively, the PWM circuit 930 may be used to supply one or more signals to power amplifiers or power supplies, such as DC/DC or AC/DC converters, according to this disclosure. For example, the processor 910 may control the PWM circuit 930 to output a signal corresponding to a determined duty cycle or power supply voltage as discussed above with respect to blocks 840 and 850.

While some examples of methods and systems herein are described in terms of software executing on various machines, the methods and systems may also be implemented as specifically-configured hardware, such as field-programmable gate array (FPGA) specifically to execute the various methods. For example, examples can be implemented in digital electronic circuitry, or in computer hardware, firmware, software, or in a combination thereof. In one example, a device may include a processor or processors. The processor comprises a computer-readable medium, such as a random access memory (RAM) coupled to the processor. The processor executes computer-executable program instructions stored in memory, such as executing one or more computer programs. Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example computer-readable storage media, that may store instructions that, when executed by the processor, can cause the processor to perform the steps described herein as carried out, or assisted, by a processor. Examples of computer-readable media may include, but are not limited to, an electronic, optical, magnetic, or other storage device capable of providing a processor, such as the processor in a web server, with computer-readable instructions. Other examples of media comprise, but are not limited to, a floppy disk, CD-ROM, magnetic disk, memory chip, ROM, RAM, ASIC, configured processor, all optical media, all magnetic tape or other magnetic media, or any other medium from which a computer processor can read. The processor, and the processing, described may be in one or more structures, and may be dispersed through one or more structures. The processor may comprise code for carrying out one or more of the methods (or parts of methods) described herein.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

Use herein of the word "or" is intended to cover inclusive and exclusive OR conditions. In other words, A or B or C includes any or all of the following alternative combinations as appropriate for a particular usage: A alone; B alone; C alone; A and B only; A and C only; B and C only; and A and B and C.

That which is claimed is:

1. A device for providing wireless power comprising:
   a power supply;
   a power amplifier coupled to the power supply, the power amplifier comprising:
     a first switch and a second switch coupled to the power supply and to a common switch output,
     a first diode coupled between an output of the first switch and an input of the first switch, the first diode biased to enable current flow from the output to the input of the first switch,
     a second diode coupled between an output of the second switch and an input of the second switch, the second diode biased to enable current flow from the output to the input of the second switch; and
   a pulse-width modulator ("PWM") coupled to the power amplifier, the PWM configured to substantially simultaneously toggle each of the first and second switches between open and closed states, and to maintain the first and second switches in opposite open and closed states;
   a controller coupled to the power supply and the PWM, the controller configured to:
     receive a sensor signal indicating an impedance of a load;
     determine a duty cycle of the PWM based on the sensor signal; and
     adjust an output voltage of the power supply based on the duty cycle of the PWM.

2. The device of claim 1, further comprising a sensor configured to detect the impedance of the load, and wherein the controller is configured to receive the sensor signal from the sensor.

3. The device of claim 1, wherein the controller is further configured to access a look-up table to determine the duty cycle of the PWM based on the impedance of the load.

4. The device of claim 1, wherein the controller is further configured to access a look-up table to determine the output voltage of the power supply based on the duty cycle.

5. The device of claim 1, wherein the controller is further configured to compute a mapping function based on the impedance to determine the duty cycle.

6. The device of claim 1, wherein the power amplifier is configured to provide substantially zero voltage switching and substantially zero current switching.

7. The device of claim 1, wherein the controller is further configured to compute a mapping function based on the duty cycle to determine the output voltage.

8. The device of claim 1, further comprising:
an impedance transformation network coupled to the common switch output; and
a transmit radio frequency ("RF") coil coupled to an output of the impedance transformation network.

9. The device of claim 8, wherein the impedance transformation network comprises at least one of a low-pass filter or a high-pass filter.

10. The device of claim 8, wherein the impedance transformation network comprises a low pass filter comprising a capacitor and an inductor coupled between the power amplifier and the transmit RF coil.

11. The device of claim 1, wherein each of the first and second switches comprises a metal-oxide-semiconductor field-effect transistor and the first and second diodes are Schottky diodes.

12. The device of claim 1, wherein the controller comprises the PWM.

13. A method for providing wireless power comprising:
receiving an indication of a load impedance;
determining a duty cycle based on the load impedance;
determining a power supply voltage based on the duty cycle;
adjusting a power supply to supply the power supply voltage;
toggling a first switch and a second switch between open and closed states to generate a power supply output, a ratio of the toggling based on the duty cycle, the first switch and the second switch switched to maintain them in opposite open or closed states, wherein a first diode is coupled between an output of the first switch and an input of the first switch and biased to circulate power from the output of the first switch and the input of the first switch, and wherein a second diode is coupled between an output of the second switch and an input of the second switch and biased to circulate power from the output of the second switch and the input of the second switch; and
outputting the power supply output to a radio frequency ("RF") transmit coil.

14. The method of claim 13, wherein determining the duty cycle comprises accessing a look-up table and selecting the duty cycle corresponding to the load impedance.

15. The method of claim 13, wherein the determining the duty cycle comprises computing a mapping function based on the load impedance to determine the duty cycle.

16. The method of claim 13, wherein determining the power supply voltage comprises accessing a look-up table and selecting the power supply voltage corresponding to the duty cycle.

17. The method of claim 13, wherein the determining the power supply voltage comprises computing a mapping function based on the duty cycle to determine the power supply voltage.

18. The method of claim 13, wherein toggling the first and second switches comprises toggling the first and second switches in a substantially zero voltage switching mode and a substantially zero current switching mode.

* * * * *